United States Patent
Lukanc et al.

(10) Patent No.: US 6,768,204 B1
(45) Date of Patent: Jul. 27, 2004

(54) SELF-ALIGNED CONDUCTIVE PLUGS IN A SEMICONDUCTOR DEVICE

(75) Inventors: Todd P. Lukanc, San Jose, CA (US); Fei Wang, San Jose, CA (US); Darrell M. Erb, Los Altos, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/826,185

(22) Filed: Apr. 5, 2001

(51) Int. Cl.[7] .............................................. H01L 23/48
(52) U.S. Cl. ..................... 257/774; 257/773; 257/758; 257/759
(58) Field of Search ................................. 257/758–762, 257/773, 774; 438/620, 622, 180, 638, 706, 618

(56) References Cited

U.S. PATENT DOCUMENTS

| | | | | |
|---|---|---|---|---|
| 4,090,006 A | * | 5/1978 | Havas et al. | 257/758 |
| 5,916,823 A | * | 6/1999 | Lou et al. | 438/638 |
| 6,037,664 A | * | 3/2000 | Zhao et al. | 257/758 |
| 6,040,243 A | * | 3/2000 | Li et al. | 438/687 |
| 6,083,822 A | * | 7/2000 | Lee | 257/762 |
| 6,110,826 A | * | 8/2000 | Lou et al. | 257/762 |
| 6,127,089 A | * | 10/2000 | Subramanian et al. | 438/638 |
| 6,204,168 B1 | * | 3/2001 | Naik et al. | 257/758 |
| 6,316,351 B1 | * | 11/2001 | Chen et al. | 438/638 |
| 6,333,557 B1 | * | 12/2001 | Sullivan | 257/758 |
| 6,337,518 B1 | * | 1/2002 | Grill et al. | 257/758 |

* cited by examiner

*Primary Examiner*—Eddie Lee
*Assistant Examiner*—Quang Vu

(57) ABSTRACT

The present invention provides for improved alignment of an opening in a lower dielectric layer with an opening in an upper dielectric layer. This improved alignment is beneficial as it improves the functionality of devices with dual damascene material arrangements, as normal misalignments do not deem the devices inferior or non-functional. Further, the present invention is beneficial as it allows for a designer, such as a microprocessor designer, to depend on more predictable conductive characteristics of contacts between a first conductive region and a second conductive region.

10 Claims, 12 Drawing Sheets

SELF-ALIGNED CONDUCTIVE PLUGS IN A SEMICONDUCTOR DEVICE

FIELD OF THE INVENTION

The present invention relates to an apparatus and method of forming self-aligned conductive plugs between a conductive line and a conductive region.

DESCRIPTION OF RELATED ART

In the semiconductor manufacturing industry, the concept of dual damascene is utilized to form conductive plugs and conductive lines in a self-aligned manner to electrically connect two conductive regions. Although the concept of forming conductive lines and conductive plugs has many advantages, there are several shortcomings. One shortcoming is the potential of misalignment of conductive plugs and conductive lines due to small misalignments that are typical in submicron technologies. The following is a description of a dual damascene conductive line and conductive plug formation and how this formation may be compromised by small misalignments.

FIG. 1A depicts five layers of material that are deposited over one another. The bottom layer is a semiconductor substrate 10. The semiconductor substrate 10 may comprise different regions with different characteristics and materials typical of semiconductor devices. Over the semiconductor substrate 10 is a conductive region 12. FIG. 1A shows conductive region 12 running along the page, however, the conductive region 12 can be surrounded by material that electrically isolates the conductive region 12. Over conductive region 12 dielectric layer 14 is formed. It is through dielectric layer 14 that a conductive plug will eventually be formed. Over dielectric layer 14 an etch stop layer 16 is formed. The etch stop layer 16 is intended to be patterned in a subsequent step and is intended to define the dimensions of the conductive plug to be formed through dielectric layer 14. Finally, in FIG. 1A, a resist layer 18 is deposited over the etch stop layer 16.

FIG. 1B depicts the layers of FIG. 1A, after the resist layer 18 has been etched using photolithography to form an opening 20 down to the etch stop layer 16. The opening 20 in the resist layer 18 defines how the etch stop layer 16 will be patterned and ultimately defines the shape of the conductive plug in the dielectric layer 14.

FIG. 1C depicts the layers of FIG. 1B, after the etch stop layer 16 has been patterned or etched as defined by the opening 20, of FIG. 1B, in resist layer 18. Accordingly, opening 20 extends through the etch stop layer 16 to form opening 21, which in a subsequent step will define the shape of a conductive plug formed in dielectric layer 14.

FIG. 1D depicts the layers of FIG. 1C, after the resist layer 18 has been removed. Resist layer 18 is no longer necessary, as its purpose was to define opening 22 in etch stop layer 16. FIG. 1E depicts the layers of FIG. 1D, after a second dielectric layer 24 is formed over the first dielectric layer 14 and the etch stop layer 16. Further, a resist layer 26 is formed over the second dielectric layer 24.

FIG. 1F depicts the layers of FIG. 1E after an opening 28 is formed in the resist layer 26. Opening 28 may be created through conventional photolithography techniques. The opening 28 is shaped to define a trench that will be formed in second dielectric layer 24 in a subsequent step.

FIG. 1G depicts the layers of FIG. 1F after an opening 30 has been formed through the first dielectric layer 14 and the second dielectric layer 24. This opening 30 can be formed by a single anisotropic etch step or multiple anisotropic etch steps that etch through the second dielectric layer 24 to form a trench and through the first dielectric layer 14 to form a via. The first dielectric layer 14 and the second dielectric layer 24 can be etched either in one step or selectively etched in two steps. The portion of the opening 30 that is proximate to the first dielectric layer 14 is defined by the opening 22 in etch stop layer 16. As shown in FIG. 1H, after the first dielectric layer 14 and the second dielectric layer 24 are etched, the resist layer 26 is removed. One method for the removal of the resist layer 26 is a polishing process. After the removal of the resist layer 26, the opening 30, of FIG. 1G, is reduced to opening 32. As shown, in FIG. 1I, opening 32, of FIG. 1H, is filled with a conductive material 34. The conductive material 34 forms both a conductive line and a conductive plug. The conductive plug electrically connects the conductive line to the conductive region 12.

FIG. 2A is a top view of an ideal dual damascene formation which connects a lower conductive region 40 with conductive line 38 through a conductive plug, wherein the conductive plug is defined by opening 42 in an etch stop layer. For simplification, it is shown that conductive line 38 runs in a vertical direction of the page, while the lower conductive region 40 runs perpendicularly in the horizontal direction of the page. At the intersection of the lower conductive region 40 and the conductive line 38, the conductive plug is formed.

FIG. 2B is a cross-sectional view of FIG. 2A along line 2B drawn on FIG. 2A. It is shown in FIG. 2B that conductive line 38 is separated from conductive region 40 by dielectric layer 50 and etch stop layer 48. The conductive region 40 and the conductive line 38 are connected by conductive plug 43. As the formation depicted in FIG. 2B is a dual damascene formation, conductive line 38 and conductive plug 43 are integrated together and therefore must be made of the same conductive material. Conductive region 40 is in contact with conductive plug 43 and is electrically connected thereby to conductive line 38. FIG. 2C is a cross-sectional view of FIG. 2A along line 2C drawn on FIG. 2A. FIG. 2C illustrates how conductive region 40 can be formed in semiconductor substrate 10.

One aspect of FIGS. 2A–2C, that one of ordinary skill in the art would appreciate, is that the conductive plug 43 is perfectly aligned between the conductive line 38 and the conductive region 40 and the via which the conductive plug 43 fills is entirely defined by the opening 42 in the etch stop layer 48.

FIGS. 3A–3C illustrate a typical dual damascene formation of the prior art, that is similar to the dual damascene formation illustrated in FIGS. 2A–2C. However, a disadvantage is illustrated of misalignment and deformation of conductive plug 61. FIG. 3A is a top view of such a dual damascene formation. FIG. 3B is a cross-sectional view of FIG. 3A along line 3B. FIG. 3C is a cross-sectional view of FIG. 3A along line 3C.

In FIGS. 3A–3C it is illustrated that conductive plug 61 is not aligned correctly under conductive line 54. As shown in FIG. 3B, it was intended for the conductive plug 61 to be defined by an opening 58 in the etch stop layer 66. However, because of misalignment of opening 58, only a portion of the intended conductive plug 61 is actually formed between conductive region 40 and the conductive line 54. The opening 58 is partially covered by the second dielectric layer 64, which prevents the etch stop layer 66 from adequately defining conductive plug 61, as intended, because of the misalignment. Hence, the misalignment causes conductive plug 61 to be much smaller than intended; this effect is a serious disadvantage. For instance, the dual damascene structure may be a component of a microprocessor, with the designer of the microprocessor intending for a certain current to flow through the conductive plug 61 to optimize the maximum operating speed of the microprocessor. The microprocessor will be limited by defective conductive plug 61 and will only operate at a slower, less desirable, speed than intended. Further, if the misalignment is so extreme, a conductive plug may not even be formed and the microprocessor functionality will be seriously compromised.

There are a number of disadvantages to conventional dual damascene methods of formation. One of these disadvantages is that there is a very limited tolerance to misalignments of an opening in the etch stop layer that is intended to define a conductive plug. As a result of such misalignment, a conductive plug can be formed smaller than intended and substantially limit the functionality of a device comprising such a compromised dual damascene formation. Another disadvantage is the possibility that an opening in the etch stop layer is completely misaligned with the conductive line, resulting in a conductive plug not being formed.

SUMMARY OF THE INVENTION

There is a need for a dual damascene method and apparatus that would mitigate the problem of misalignment of a conductive plug with a conductive line. More particularly, there is a need to prevent the performance of devices from being compromised that employ such a dual damascene formation to electrically connect a conductive region with a conductive line. Further, there is a need for a dual damascene formation that prevents the non-functionality of a device employing such a dual damascene structure because of misalignment of an opening in an etch stop layer with a conductive line.

These and other needs are met by embodiments of the present invention, which provide a method and apparatus of aligning a conductive plug with a conductive line. The present invention utilizes an enlarged opening in an etch stop layer, such that part of the conductive plug is defined by the opening in an upper dielectric layer and part of the conductive plug is defined by an opening in the etch stop layer. More particularly, the opening in the etch stop layer overlaps the opening in the upper dielectric layer, such that misalignments can be tolerated without compromising the integrity of the formed conductive plugs. The present invention further accommodates different configurations by which the conductive plugs are defined by both an opening in the upper dielectric layer and an opening in the etch stop layer.

One embodiment of the present invention accommodates these different configurations by ensuring that the size of the different conductive plug configurations are the same to maximize the performance of the device comprising such a dual damascene formation. More particularly, it is important in some types of devices that the conductive plugs be of uniform size to substantially conduct electricity at the same rate between a conductive region and a conductive line in differently configured conductive plugs.

The foregoing and other features, aspects, and advantages of the present invention will become more apparent from the following detailed description of the present invention taken in conjunction with the accompanying drawings.

DETAILED DESCRIPTION OF THE INVENTION

The present invention addresses and solves problems associated with misaligned and deformed conductive plugs in a dual damascene arrangement. Specifically, the present invention allows for tolerance of the misalignment of an opening in an etch stop layer, wherein the etch stop layer is disposed between a lower dielectric layer and an upper dielectric layer. This is accomplished by an enlarged opening in the etch stop layer, arranged such that an opening formed in the lower dielectric layer is partially defined by the edges of an opening in the upper dielectric layer and partially defined by the edges of the opening in the etch stop layer. Specially, a portion of the opening in the etch stop layer overlaps the opening in the upper dielectric layer.

More particularly, the lower dielectric layer is formed over a first conductive region. Over the lower dielectric layer, an etch stop layer is formed and selectively etched to form an enlarged opening. Over the etch stop layer an upper dielectric layer is formed. An opening in the upper dielectric layer is formed, at least partially overlapping the opening in the etch stop layer. Through an anisotropic etch, an opening is formed in the lower dielectric layer utilizing both the border of the opening in the etch stop layer and the border of the opening in the upper dielectric layer. Small misalignments of the opening in the upper dielectric layer and the enlarged opening in the etch stop layer will not affect the size and shape of the opening formed in the lower dielectric layer. This allows for some tolerance of normal misalignments of the opening formed in an etch stop layer and the opening formed in the upper dielectric layer. The openings in the upper and lower dielectric layers are then filled with conductive material to form a conductive line and a conductive plug.

There are several advantages of the present invention. One advantage is that there is increased assurance that an opening in the upper dielectric layer will be adequately aligned with the opening in the lower dielectric layer, because the opening formed in the lower dielectric layer is defined by the overlap of the opening in the etch stop layer and the opening in the upper dielectric.

Another aspect and advantage of the present invention is the flexibility in the manner in which the enlarged opening in the etch stop layer overlaps the opening in the upper dielectric layer. More particularly, there are different ways that an enlarged opening in the etch stop layer can overlap an opening in an upper dielectric layer. This aspect of the present invention allows for the different ways of forming openings in a lower dielectric layer having consistent material displacement. This allows for uniform conductive characteristics of conductive material fillings formed in the openings in the lower dielectric layer.

Figure 1A:
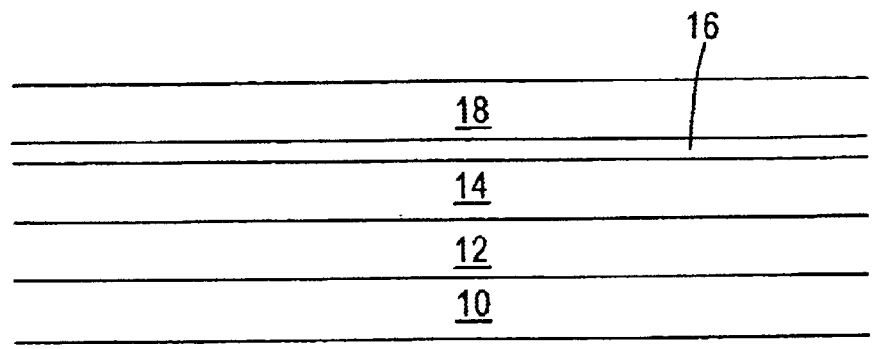
FIGS. 1A–1I depict a prior art dual damascene formation.
Figure 1B:
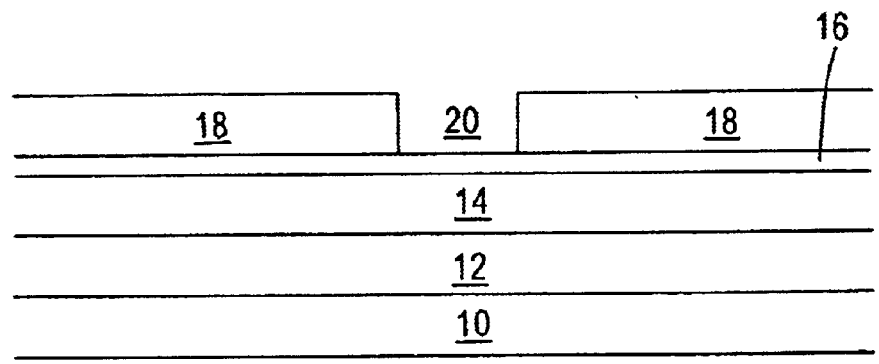
Figure 1C:
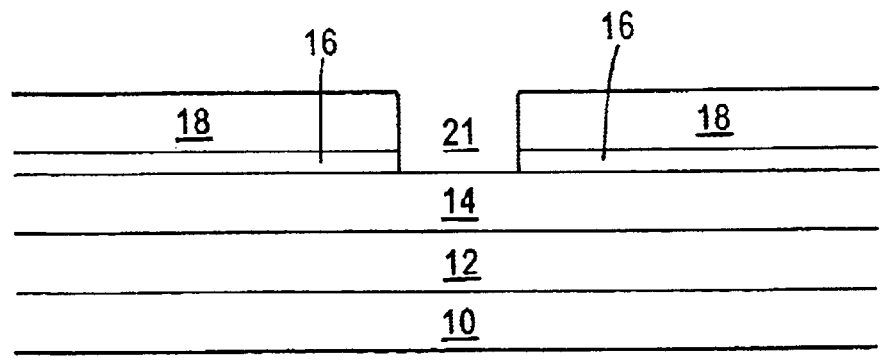
Figure 1D:
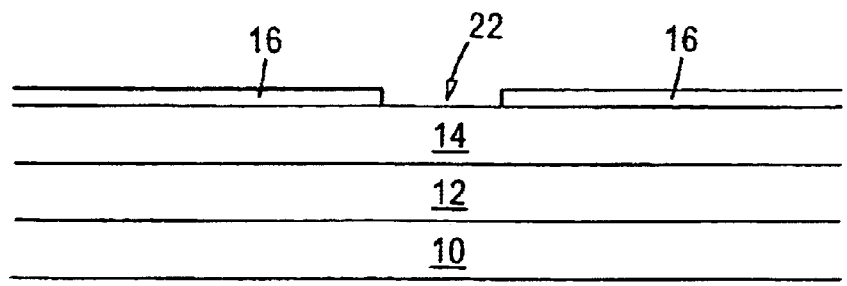
Figure 1E:
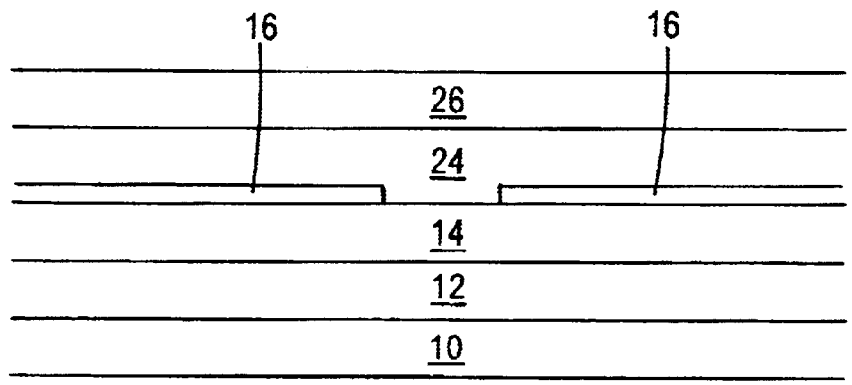
Figure 1F:
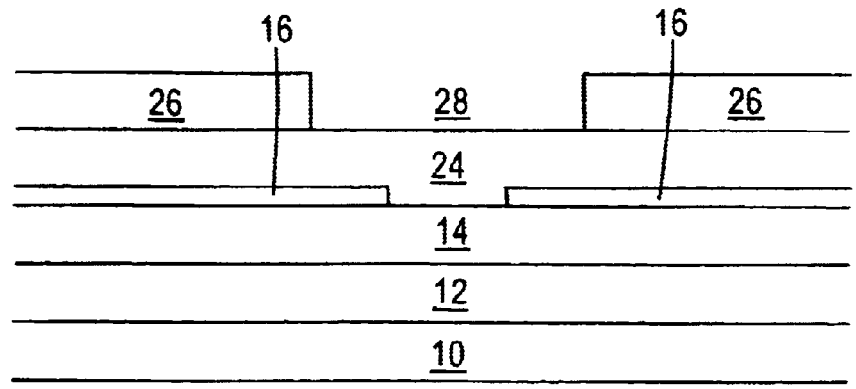
Figure 1G:
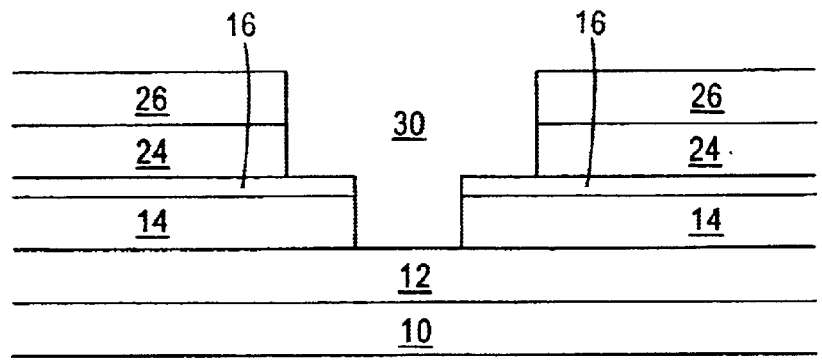
Figure 1H:
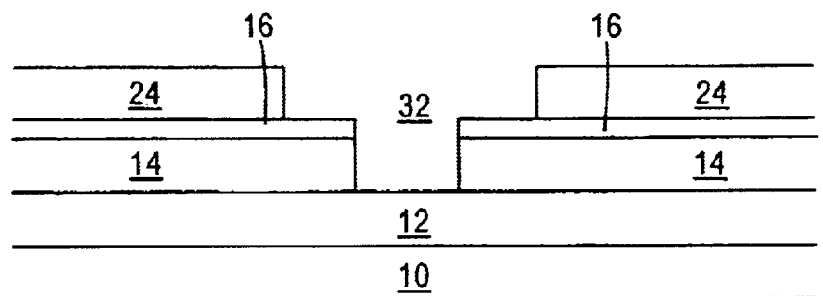
Figure 1I:
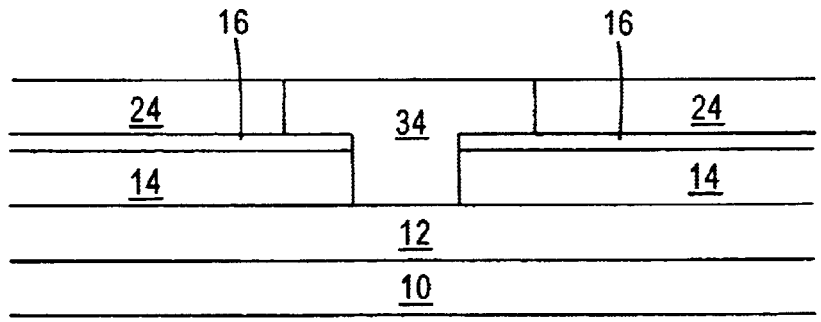
Figure 2A:
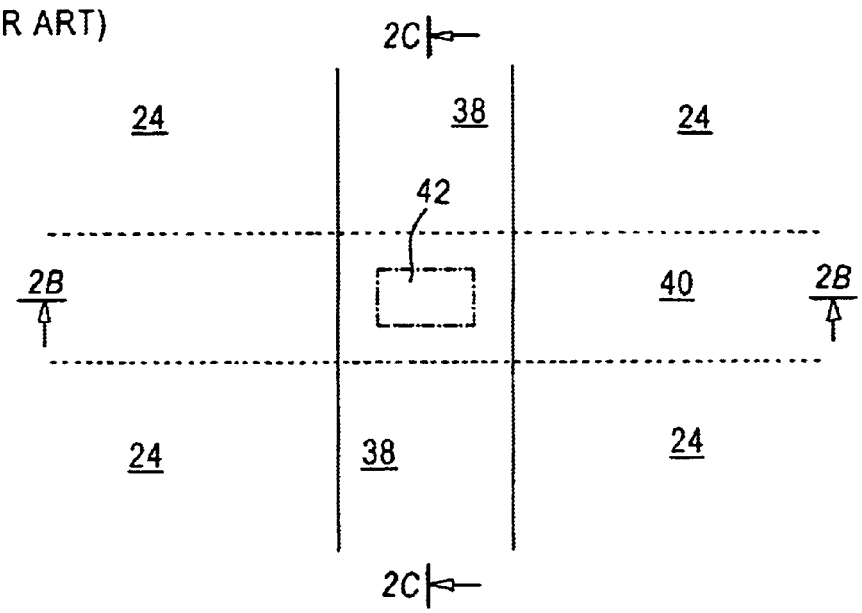
FIGS. 2A–2C depict an ideal prior art dual damascene formation.
Figure 2B:
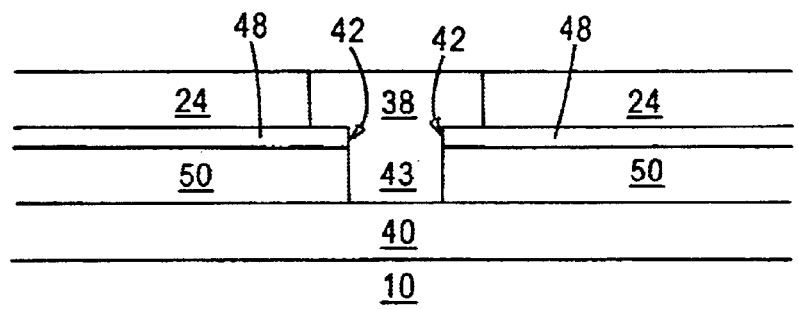
Figure 2C:
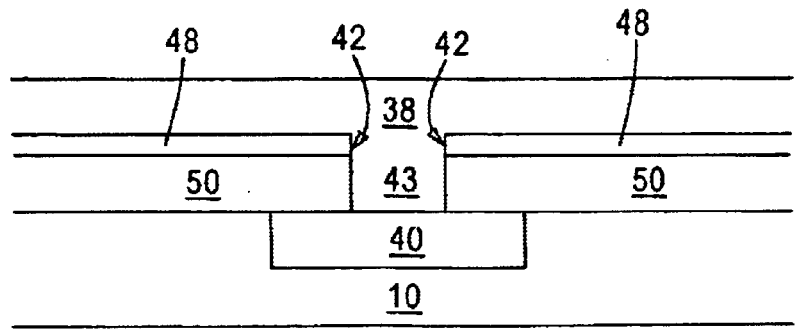
Figure 3A:
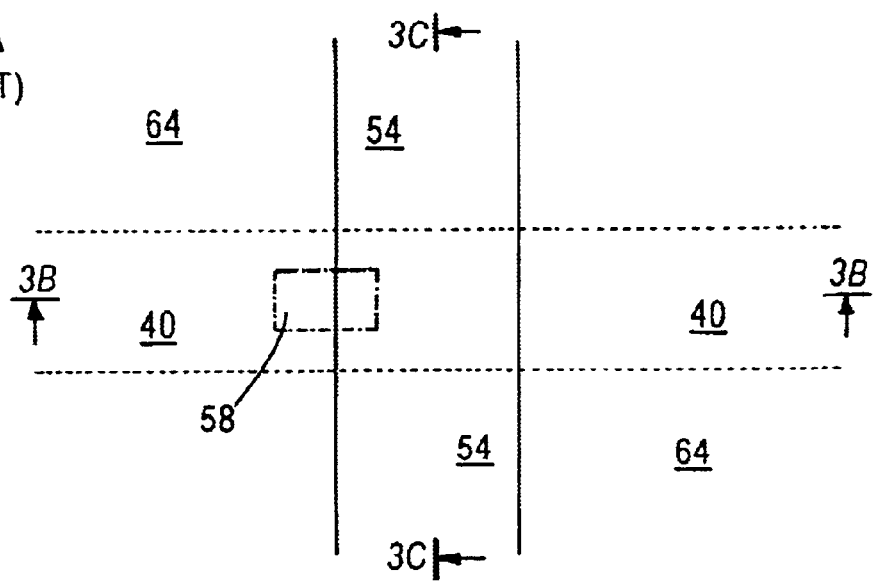
FIGS. 3A–3C depict a typical prior art dual damascene formation.
Figure 3B:
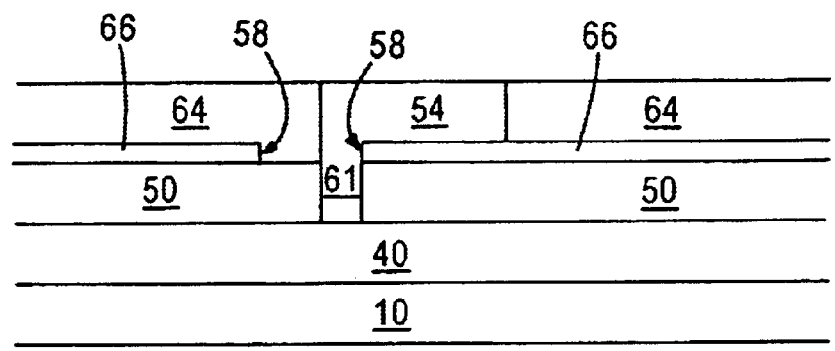
Figure 3C:
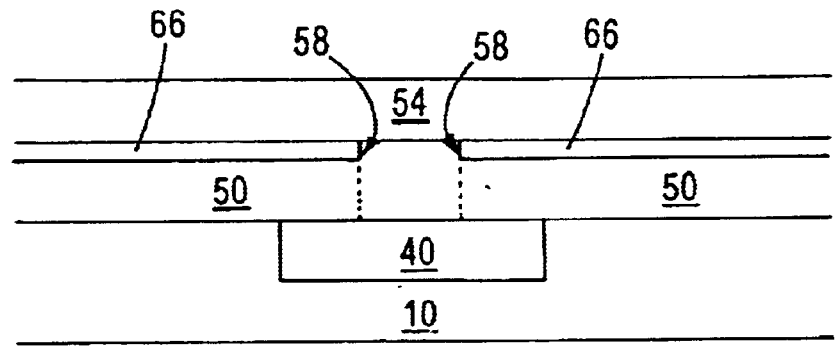
Figure 4A:
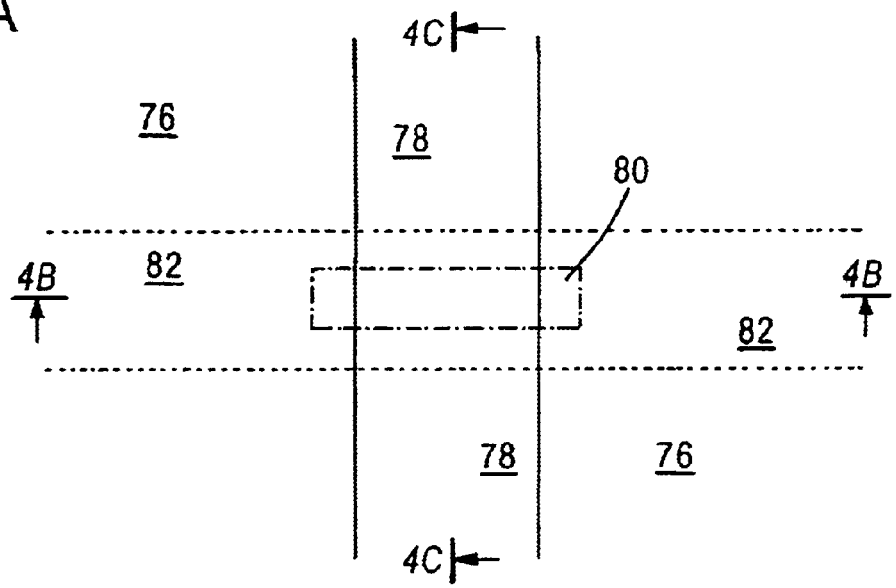
FIGS. 4A–4C, 5A–5C, 6A–6C, 7A–7C, 8A–8C, and 9A–9C, depict different configurations of a conductive plug formed in accordance with embodiments of the present invention.
Figure 4B:
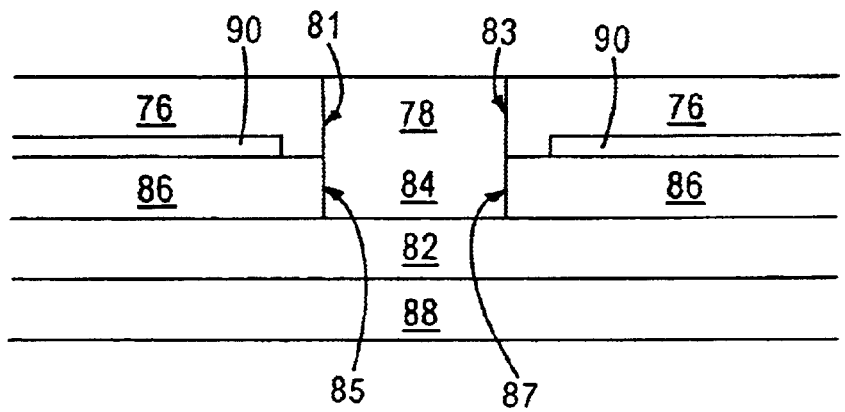
Figure 4C:
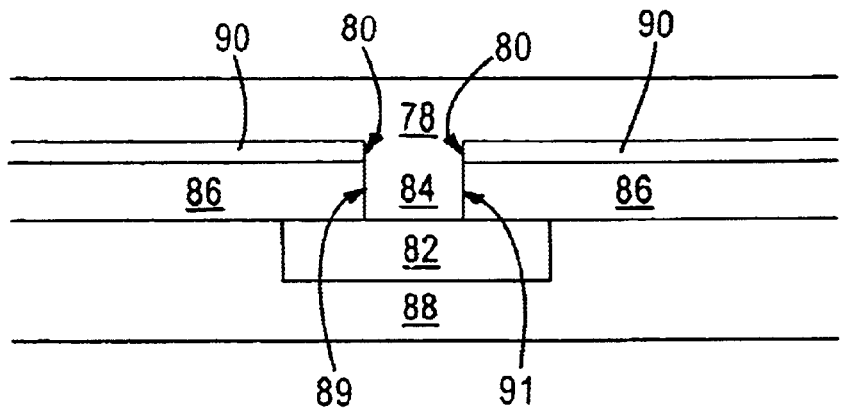

FIGS. 4A–4C illustrate the alignment of a conductive plug 84 in a first dielectric layer 86 with a conductive line 78 in a second dielectric layer 76. Two of the sides 85, 87 of conductive plug 84 are defined by two sides 81, 83 of conductive line 78 formed in the second dielectric layer 76. The other two sides 89, 91 of conductive plug 84 are defined by an opening 80 in an etch stop layer 90, which is deposited in between the first dielectric layer 86 and the second dielectric layer 76.

FIG. 4A illustrates a top view of this embodiment, wherein a conductive line 78 (i.e. copper or copper alloy), fills a trench in second dielectric layer 76 and extends vertically on the page. Conductive region 82, formed under the first dielectric layer 86, is illustrated extending horizontally on the page. Conductive region 82 may be formed in semiconductor substrate 88. Opening 80 in the etch stop layer 90 is between the first dielectric layer 86 and the second dielectric layer 76. The opening 80 in the etch stop layer 90 is seen to overlap trench 78. The embodiments of the present of invention, opening 80 is formed in etch stop layer 90 subsequent to the deposition of the etch stop layer 90 over the first dielectric layer 86 and prior to the deposition of second dielectric layer 76. The opening 80 may be formed using photolithography techniques.

FIG. 4B is a cross-sectional view of FIG. 4A along line 4B. It is shown in FIG. 4B that conductive plug 84 extends vertically between conductive line 78 and conductive region 82. It is apparent that sides 85, 87 of conductive plug 84 are defined by sides 81, 83 of the opening in second dielectric layer 76, which conductive line 78 fills. Accordingly, side 81 is coplanar with side 85 and side 83 is coplanar with side 87. FIG. 4C shows a cross-sectional view of FIG. 4A along the line 4C. From this illustration, it is apparent that the two opposing sides 89, 91 of conductive plug 84 are defined by the opening 80 in etch stop layer 90.

Figure 5A:
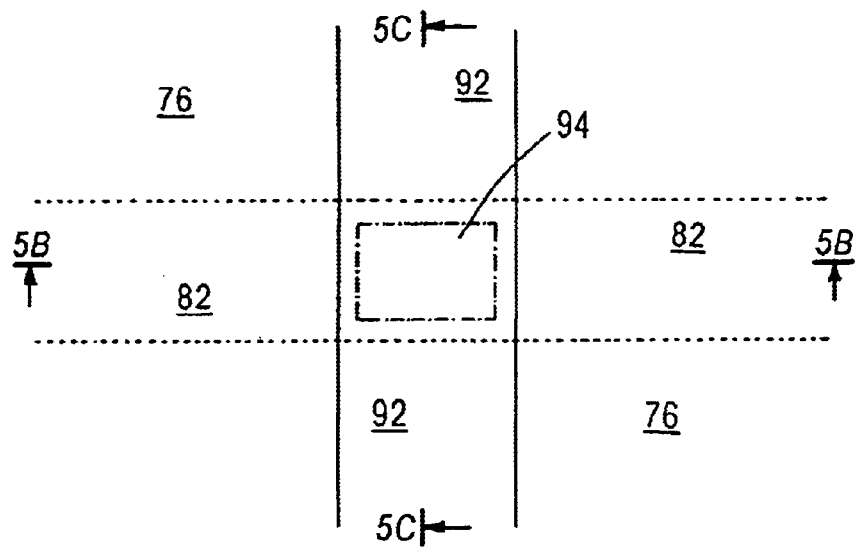
Figure 5B:
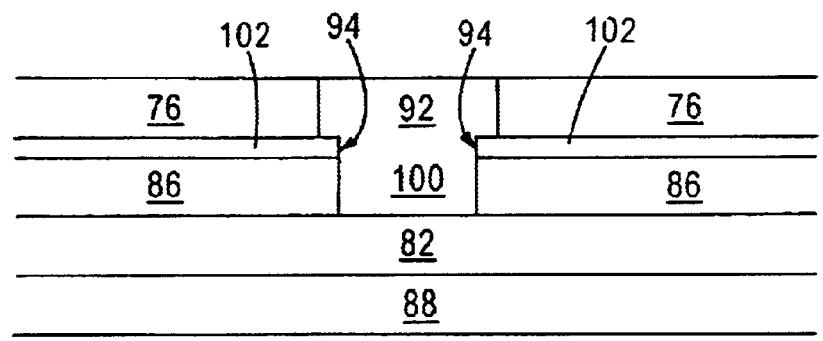
Figure 5C:
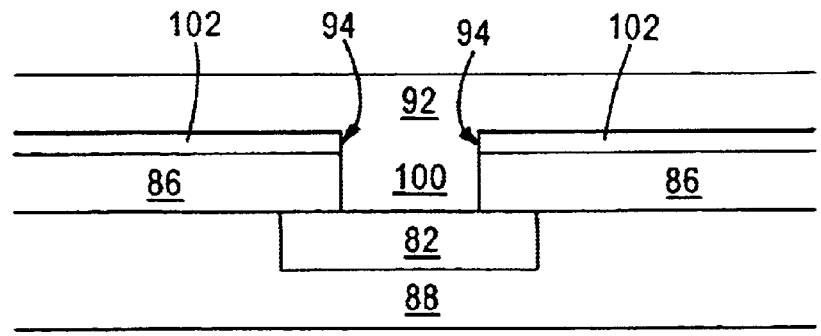

FIGS. 5A–5C are similar to FIGS. 4A–4C. However, in this embodiment the opening 94 in the etch stop layer 102 does not overlap conductive line 92. Accordingly, conductive plug 100 is entirely defined by the opening 94 on all sides. One feature illustrated in FIGS. 5A–5C is that the opening 94 is configured such that the conductive plug 100 has the same material displacement from first dielectric layer 86 and surface area along conductive region 82 as the conductive plug 84 illustrated in FIGS. 4A–4C. This is an important attribute, as the material displaced and the surface area of conductive plug 100 allow for consistent electrical properties for conductive plugs with different configurations. For example, the conductive plug 100 and the conductive plug 84 can be tailored to have the same surface area along conductive region 82 and material displacement.

Figure 6A:
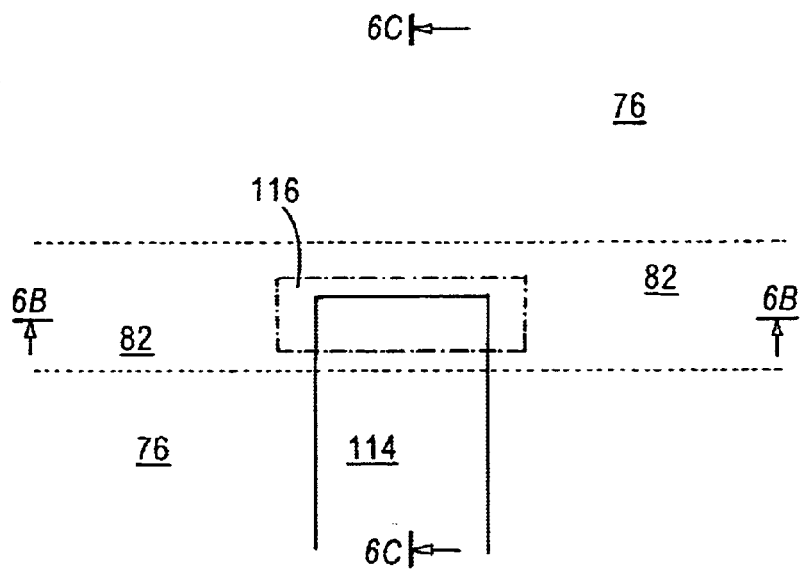
Figure 6B:
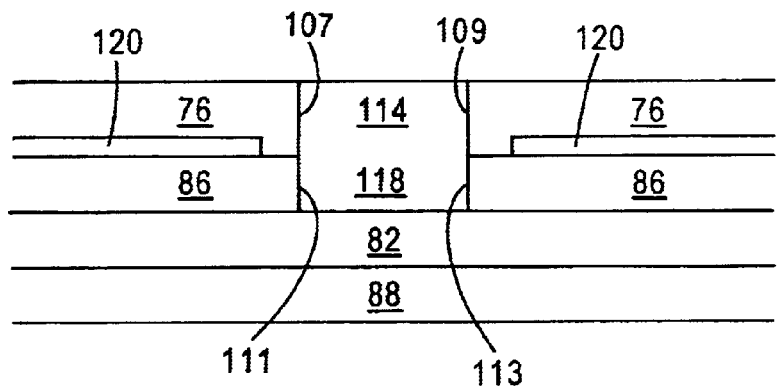
Figure 6C:
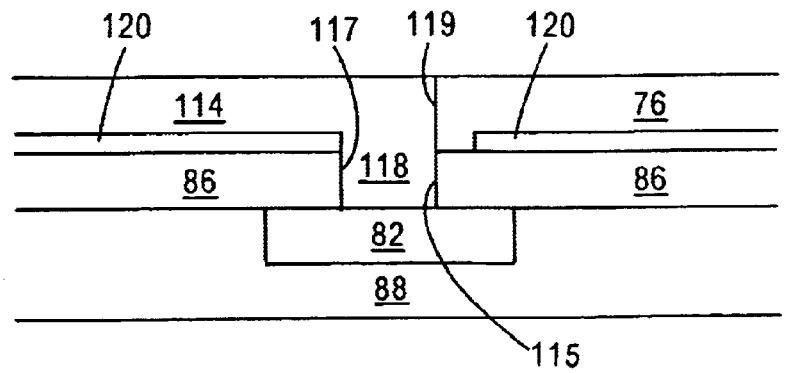

FIGS. 6A–6C depict a top view and cross-sectional views of a dual damascene arrangement, wherein the conductive plug 118 is coplanar on three sides 111, 113, 115 with conductive line 114 and defined on one side 117 by the opening 116 in etch stop layer 120. This is accomplished by the opening 116 overlapping conductive line 114 on three sides. The conductive plug 118 can be tailored to have the same surface area along conductive region 82 and material displacement from first dielectric layer 86 as other conductive plugs having different configurations, such as those shown in FIGS. 4A–4C and 5A–5C.

Figure 7A:
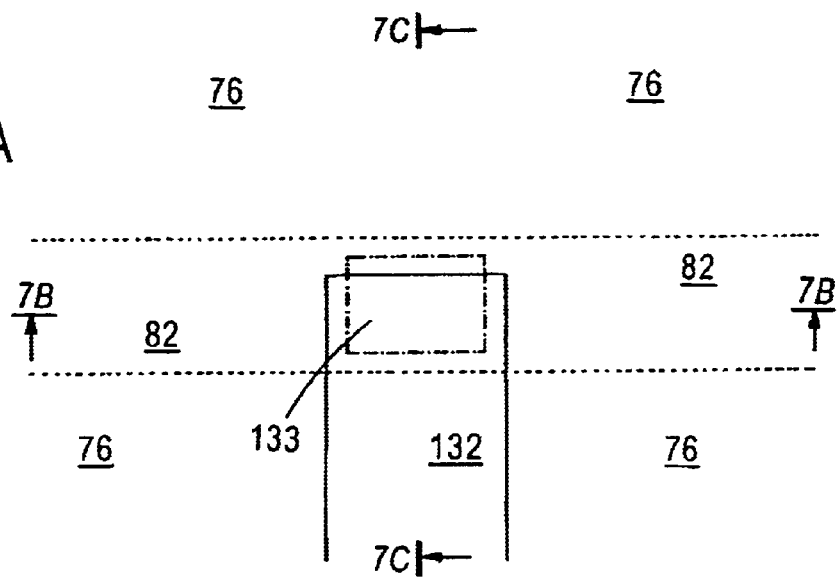
Figure 7B:
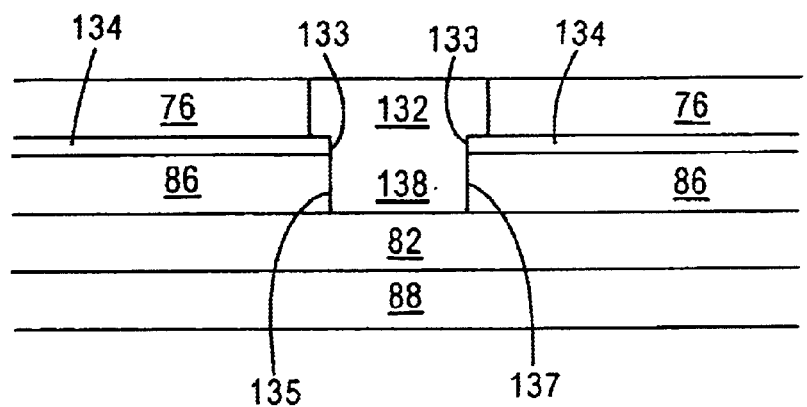
Figure 7C:
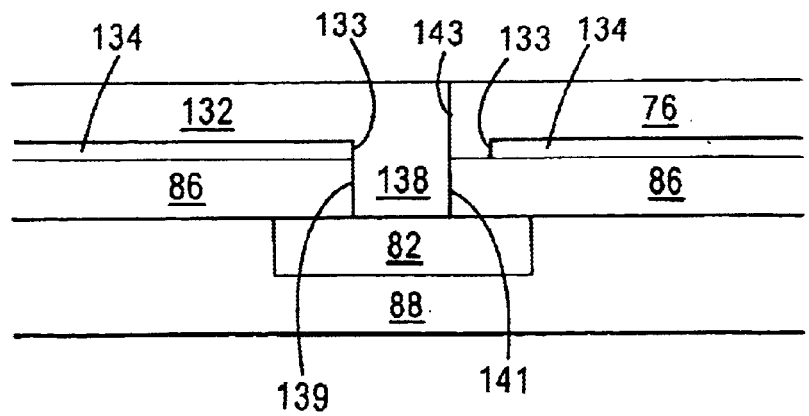

FIGS. 7A–7C illustrate conductive plug 138 defined on three sides by opening 133 in the etch stop layer 134. A fourth side 141 of conductive plug 138 is coplanar with side 143 of conductive line 132. Accordingly, conductive plug 138 can be tailored such that the surface area along conductive region 82 and material displacement from first dielectric layer 86 is essentially the same as conductive plugs with different configurations, such as that shown in FIGS. 4A–4C, 5A–5C, and 6A–6C.

Figure 8A:
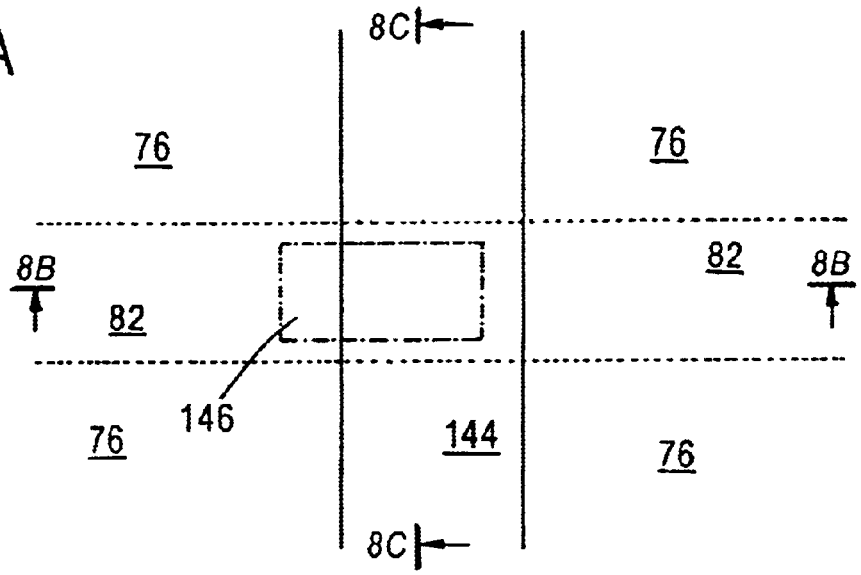
Figure 8B:
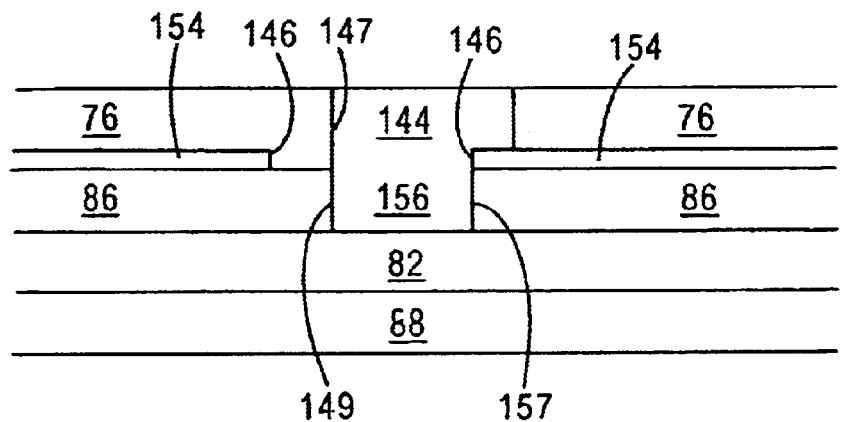
Figure 8C:
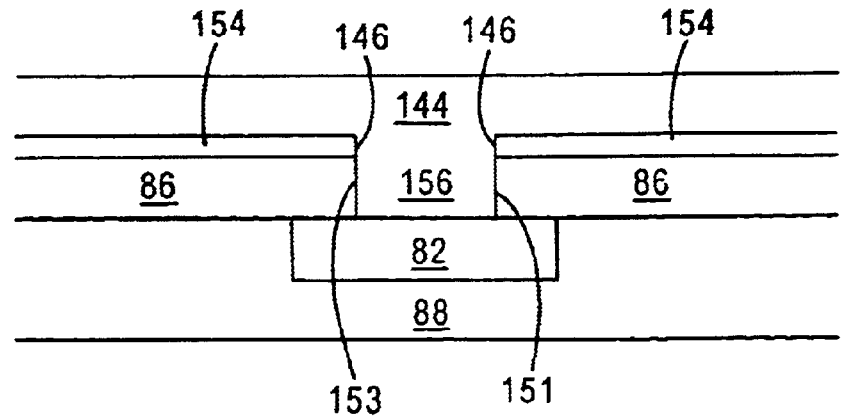

FIGS. 8A–8C are similar to FIGS. 7A–7C, wherein conductive plug 156 is defined on three sides 151, 153, 157 by opening 146 in an etch stop layer 154 and one side 149 is coplanar with side 147 of conductive line 144. The structure illustrated in FIGS. 8A–8C differs from the structure illustrated in FIGS. 7A–7C, by the orientation of the overlap of opening 146 and conductive line 144. Accordingly, conductive plug 156 can be tailored such that it has the same surface area along conductive region 82 and material displacement from first dielectric layer 86 as other conductive plugs having different configurations, such as those illustrated in FIGS. 4A–4C, 5A–5C, 6A–6C, and 7A–7C.

Figure 9A:
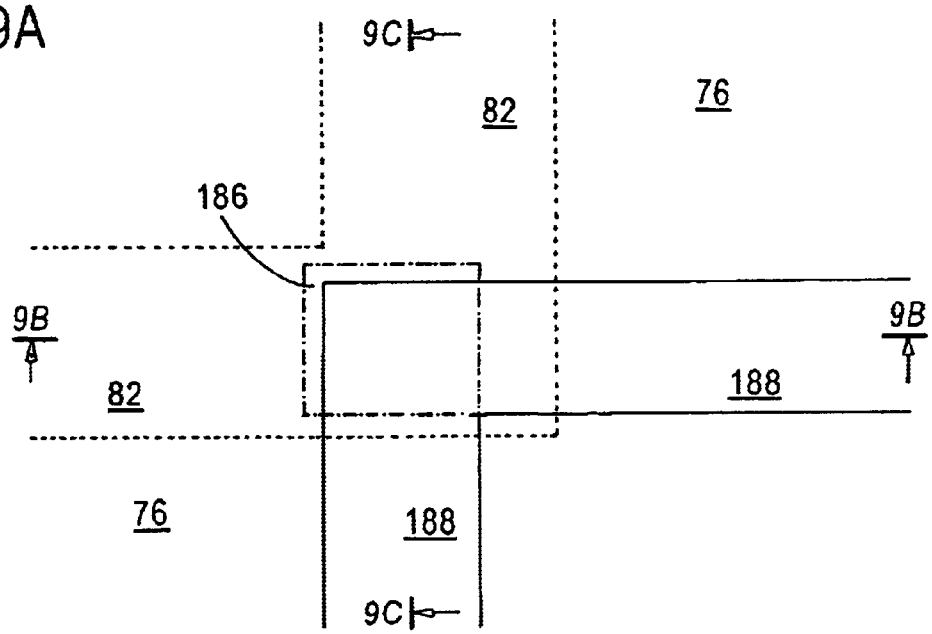
Figure 9B:
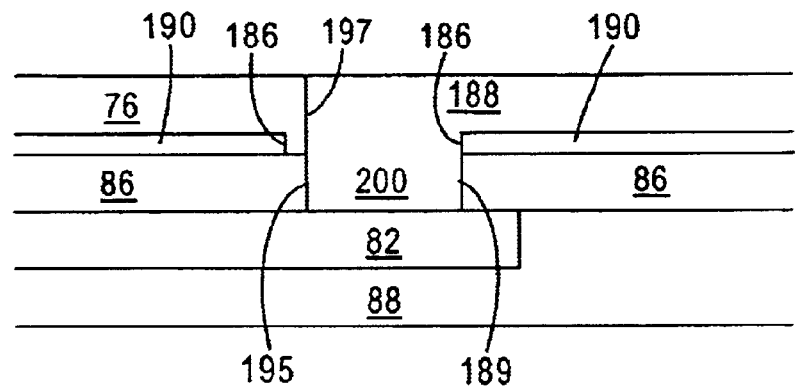
Figure 9C:
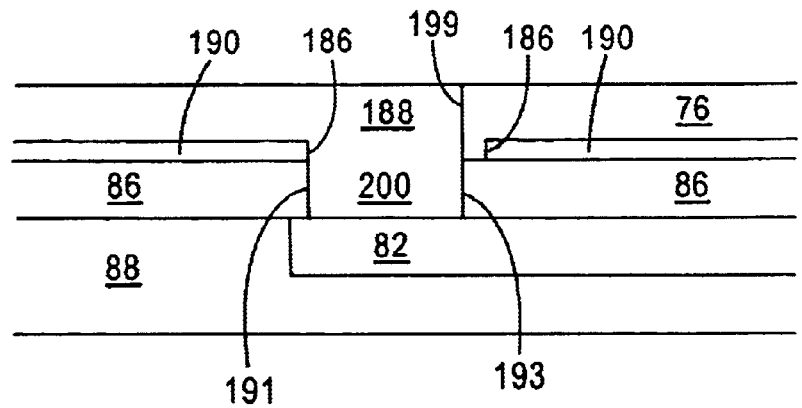

FIGS. 9A–9C are most similar to those illustrated in FIGS. 4A–4C. FIGS. 9A–9C illustrate how two sides 189, 191 of conductive plug 200 are defined by an opening 186 in an etch stop layer 190. The two other adjacent sides of conductive plug 200 are coplanar with sides 197, 199 of conductive line 188. Conductive plug 200 can be tailored such that the surface area along conductive region 82 and material displacement are from the first dielectric layer 86 is the same as in different conductive plug configurations, such as those illustrated in FIGS. 4A–4C, 5A–5C, 6A–6C, 7A–7C, and 8A–8C.

Figure 10A:
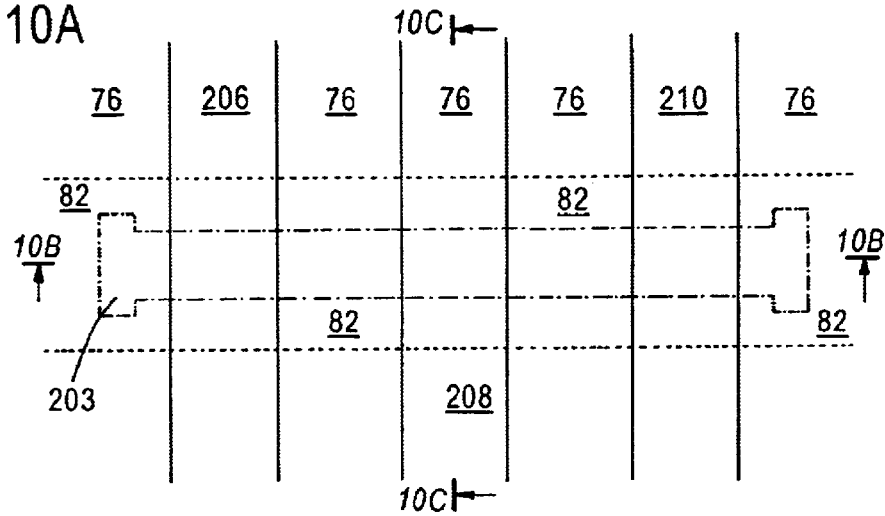
FIGS. 10A–10C illustrate an embodiment of the present invention, wherein several conductive plugs are formed with one opening in an etch stop layer.
Figure 10B:
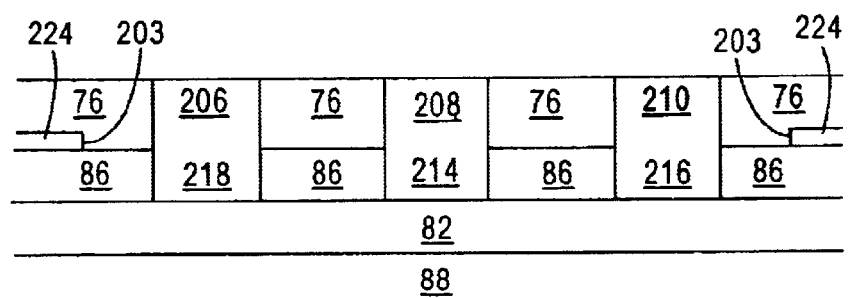
Figure 10C:
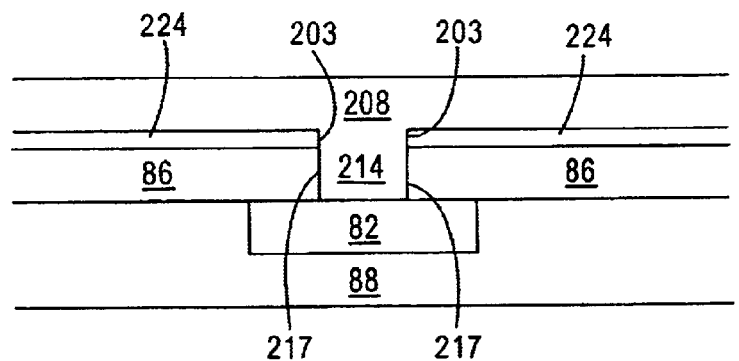

FIGS. 10A–10C illustrate how a plurality of conductive plugs 214, 216, 218 can be defined by one opening 203 in an etch stop layer 224. Conductive plugs 214, 216, and 218 all have two sides coplanar with conductive lines 206, 208, and 210 and are all defined on two sides, 215, 217 by opening 203 in etch stop layer 224. As illustrated in FIG. 10A, the opening 203 extends horizontally on the page under and overlapping the three conductive lines 206, 208, 210. In order to accommodate to the etching of opening 203, widened portions 205, 207 at the end of opening 203 is necessary, to accommodate for a relatively narrow dimension through the length of opening 203.

In embodiments depicted in FIGS. 4A–4C, 5A–5C, 6A–6C, 7A–7C, 8A–8C, 9A–9C, and 10A–10C, which are described above, the dielectric layers are comprised of a dielectric material and the conductive line and conductive plugs are comprised of a conductive material. Specifically, the dielectric layers maybe comprised of an oxide dielectric material, a low k dielectric material, a high k dielectric material, silicone dioxide, silicon oxide, fluorinated silicon dioxide, fluorinated silicon oxide, HSQ, BCB, Flare, and Silk. The conductive plugs and conductive lines maybe comprised of copper metal or copper alloy.

One of ordinary skill in the art can appreciate that different conductive plug configurations can be formed on the same device under different circumstances. It should be noted that each of the openings can be, if desired, tailored such that the surface area along a lower conductive region and materials displaced from a dielectric layer are the same among the different conductive plug configurations.

The present provides for improved alignment of a conductive plug in a lower dielectric layer with an conductive line in an upper dielectric layer. This improved alignment is beneficial as it improves the functionality of devices with such a dual damascene arrangement, as normal misalignments do not render the devices inferior or non-functional. Further, the present invention is beneficial as it allows for a designer, such as a microprocessor designer, to rely on more predictable conductive characteristics of contacts between a first conductive region and a second conductive region.

Although the present invention has been described and illustrated in detail, it is to be clearly understood that the same is by way of illustration and example only and is not to be taken by way of limitation, the scope of the present invention being limited only by the terms of the appended claims.

What is claimed is:

1. A semiconductor arrangement comprising:

a first dielectric layer formed on a conductive layer and comprising at least one first opening exposing a portion of the conductive layer, wherein the at least one first opening displaces a predetermined amount of material from the first dielectric layer;

a second dielectric layer over the first dielectric layer, comprising at least one second opening that is coplanar with the at least one first opening on only one side; and an etch stop layer between the first dielectric layer and the second dielectric layer, wherein the etch stop layer comprises at least one third opening that defines at least one side of the at least one first opening; and a conductive line filling the at least one first opening and the at least one second opening to the exposed portion of the conductive layer, wherein each side of the at least one first opening is either defined by the at least one third opening or is coplanar with a side of the at least one second opening.

2. The arrangement of claim 1, wherein the etch stop layer comprises a material that substantially prevents the anisotropic etching of the first dielectric layer.

3. The arrangement of claim 1, wherein the at least one first opening extends completely through the first dielectric layer.

4. The arrangement of claim 1, wherein a conductive material fills the at least one first opening and the at least one second opening.

5. The arrangement of claim 4, wherein:
the conductive material comprises one of copper metal and copper alloy.

6. A semiconductor arrangement comprising:

a first dielectric layer formed on a conductive layer and comprising at least one first opening exposing a portion of the conductive layer, wherein the at least one first opening displaces a predetermined amount of material from the first dielectric layer;

a second dielectric layer over the first dielectric layer, comprising at least one second opening that is coplanar with the at least one first opening on only two adjacent sides; and an etch stop layer between the first dielectric layer and the second dielectric layer, wherein the etch stop layer comprises at least one third opening that defines at least one side of the at least one first opening;

a conductive line filling the at least one first opening and the at least one second opening to the exposed portion of the conductive layer, wherein each side of the at least one first opening is either defined by the at least one third opening or is coplanar with a side of the at least one second opening.

7. The arrangement of claim 6, wherein the etch stop layer comprises a material that substantially prevents the anisotropic etching of the first dielectric layer.

8. The arrangement of claim 6, wherein the at least one first opening extends completely through the first dielectric layer.

9. The arrangement of claim 6, wherein a conductive material fills the at least one first opening and the at least one second opening.

10. The arrangement of claim 9, wherein:
the conductive material comprises one of copper metal and copper alloy.

* * * * *